(12) United States Patent
Jeong et al.

(10) Patent No.: US 11,838,657 B2
(45) Date of Patent: Dec. 5, 2023

(54) MOBILE ELECTRONIC DEVICES HAVING MULTI-CAMERA MODULES

(71) Applicant: Samsung Electronics Co., Ltd., Suwon-si (KR)

(72) Inventors: Soyoung Jeong, Seoul (KR); Jongmin You, Seongnam-si (KR); Jeongguk Lee, Seoul (KR); Yunseok Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 203 days.

(21) Appl. No.: 17/324,586

(22) Filed: May 19, 2021

(65) Prior Publication Data
US 2022/0053150 A1 Feb. 17, 2022

(30) Foreign Application Priority Data
Aug. 11, 2020 (KR) .................. 10-2020-0100472

(51) Int. Cl.
*H04N 25/40* (2023.01)
*H01L 27/146* (2006.01)
*H04N 25/50* (2023.01)

(52) U.S. Cl.
CPC ....... *H04N 25/41* (2023.01); *H01L 27/14603* (2013.01); *H01L 27/14612* (2013.01); *H04N 25/50* (2023.01)

(58) Field of Classification Search
CPC ......... G03B 19/22; H04N 23/13; H04N 23/45
See application file for complete search history.

(56) References Cited

U.S. PATENT DOCUMENTS

| | | | |
|---|---|---|---|
| 2015/0021459 A1 | 1/2015 | Roy | |
| 2016/0028985 A1* | 1/2016 | Vogelsang | H04N 25/74 348/294 |
| 2017/0142312 A1* | 5/2017 | Dal Mutto | H04N 13/106 |
| 2019/0064640 A1* | 2/2019 | Yamajo | G03B 19/22 |

* cited by examiner

*Primary Examiner* — Clifford Hilaire
(74) *Attorney, Agent, or Firm* — Harness, Dickey & Pierce, P.L.C.

(57) ABSTRACT

A mobile electronic device includes a first camera configured to capture a first image of a subject in a first field of view and including an RGB array, a second camera configured to capture a second image of the subject in a second field of view that is different from the first field of view and including an RGBW array; and an image processor configured to generate a target image using at least one of the first or second images in accordance with a selected mode of a plurality of modes. The plurality of modes includes still image modes and video modes associated with separate, respective combinations of output speed and bit depth such that the image processor is configured to control an output of the second camera to have a different combination of output speed and bit depth based on the selected mode.

18 Claims, 8 Drawing Sheets

MOBILE ELECTRONIC DEVICES HAVING MULTI-CAMERA MODULES

CROSS-REFERENCE TO RELATED APPLICATION

This application claims the benefit under 35 U.S.C. § 119 of the Korean Patent Application No. 10-2020-0100472 filed on Aug. 11, 2020, with in the Korean Intellectual Property Office, the disclosure of which is incorporated herein by reference in its entirety.

BACKGROUND

1. Field

The present disclosure relates to mobile electronic devices having multi-camera modules.

2. Description of Related Art

Recently, various mobile electronic devices, such as smartphones and tablet computers, have employed a multi-camera module to provide various functions.

In relation to electronic devices including multi-camera modules, technologies have been developed for improving performance, quality and functions so as to satisfy various user needs. In particular, technologies for improving image quality have recently been actively researched.

SUMMARY

An aspect of the present disclosure is to provide mobile electronic devices including multi-camera modules for creating images having a high dynamic range (HDR).

According to some example embodiments, a mobile electronic device may include a first camera configured to capture a first image of a subject in a first field of view. The first camera may include a first image sensor having an RGB array including red (R) pixels, green (G) pixels and blue (B) pixels. The mobile electronic device may include a second camera configured to capture a second image of the subject in a second field of view. The second field of view may be different from the first field of view. The second camera may include a second image sensor having an RGBW array including red (R) pixels, green (G) pixels, blue (B) pixels, and white (W) pixels. The mobile electronic device may include an image processor configured to generate a target image using at least one of the first image or the second image in accordance with a selected mode that is selected from among a plurality of modes. The plurality of modes may include a plurality of still image modes and a plurality of video modes. The plurality of still image modes and the plurality of video modes may be associated with separate, respective combinations of output speed and bit depth such that the image processor is configured to control an output of the second camera to have a different combination of output speed and bit depth based on the selected mode.

According to some example embodiments, a mobile electronic device may include a first camera configured to capture a first image of a subject in a first field of view. The first camera may include a first image sensor having an RGB array including red (R) pixels, green (G) pixels and blue (B) pixels. The mobile electronic device may include a second camera configured to capture a second image of the subject in a second field of view. The second field of view may be wider than the first field of view. The second camera may include an RGBW array including red (R) pixels, green (G) pixels, blue (B) pixels, and white (W) pixels. The mobile electronic device may include a third camera configured to capture a third image of the subject in a third field of view. The third field of view may be wider than the second field of view. The second camera may include a third image sensor having a separate RGB array including red (R) pixels, green (G) pixels, and blue (B) pixels. The mobile electronic device may include an image processor configured to generate a target image using at least one of the first image, the second image, or the third image in accordance with a selected mode that is selected from among a plurality of modes. The plurality of modes may include a plurality of still image modes and a plurality of video modes, the plurality of still image modes and the plurality of video modes associated with separate, respective combinations of output speed and bit depth such that the image processor is configured to control an output of the second camera to have a different combination of output speed and bit depth based on the selected mode.

According to some example embodiments, a mobile electronic device may include a first camera configured to capture a first image of a subject in a first field of view, the first camera including a first image sensor having an RGB array including red (R) pixels, green (G) pixels, and blue (B) pixels. The mobile electronic device may include a second camera configured to capture a second image of the subject in a second field of view. The second field of view may be wider than the first field of view. The second camera may include a second image sensor having an RGBW array including red (R) pixels, green (G) pixels, blue (B) pixels, and white (W) pixels. The mobile electronic device may include a third camera configured to capture a third image of the subject in a third field of view. The third field of view may be wider than the second field of view. The third camera may include a third image sensor having a separate RGB array including red (R) pixels, green (G) pixels, and blue (B) pixels. The mobile electronic device may include an image processor configured to generate a target image using at least one of the first image, the second image, or the third image in accordance with a mode selected from among a plurality of modes. The plurality of modes may include a plurality of still image modes and a plurality of video modes. The image processor may be configured to control the second camera according at least one of the plurality of still image modes and at least one of the plurality of video modes to deliver pieces of pixel data of the second camera to the image processor by binning as pieces of RGB color data and pieces of white (W) data.

BRIEF DESCRIPTION OF DRAWINGS

The above and other aspects, features, and advantages of the present disclosure will be more clearly understood from the following detailed description, taken in conjunction with the accompanying drawings, in which:

FIG. 3 is a planar view illustrating another example of a pixel array employed in a first (or third) image sensor according to some example embodiments;

FIG. 4 is a planar view illustrating another example of a pixel array employed in a second image sensor according to some example embodiments;

DETAILED DESCRIPTION

Hereinafter, various example embodiments of the present disclosure will be described with reference to the accompanying drawings.

Figure 1:
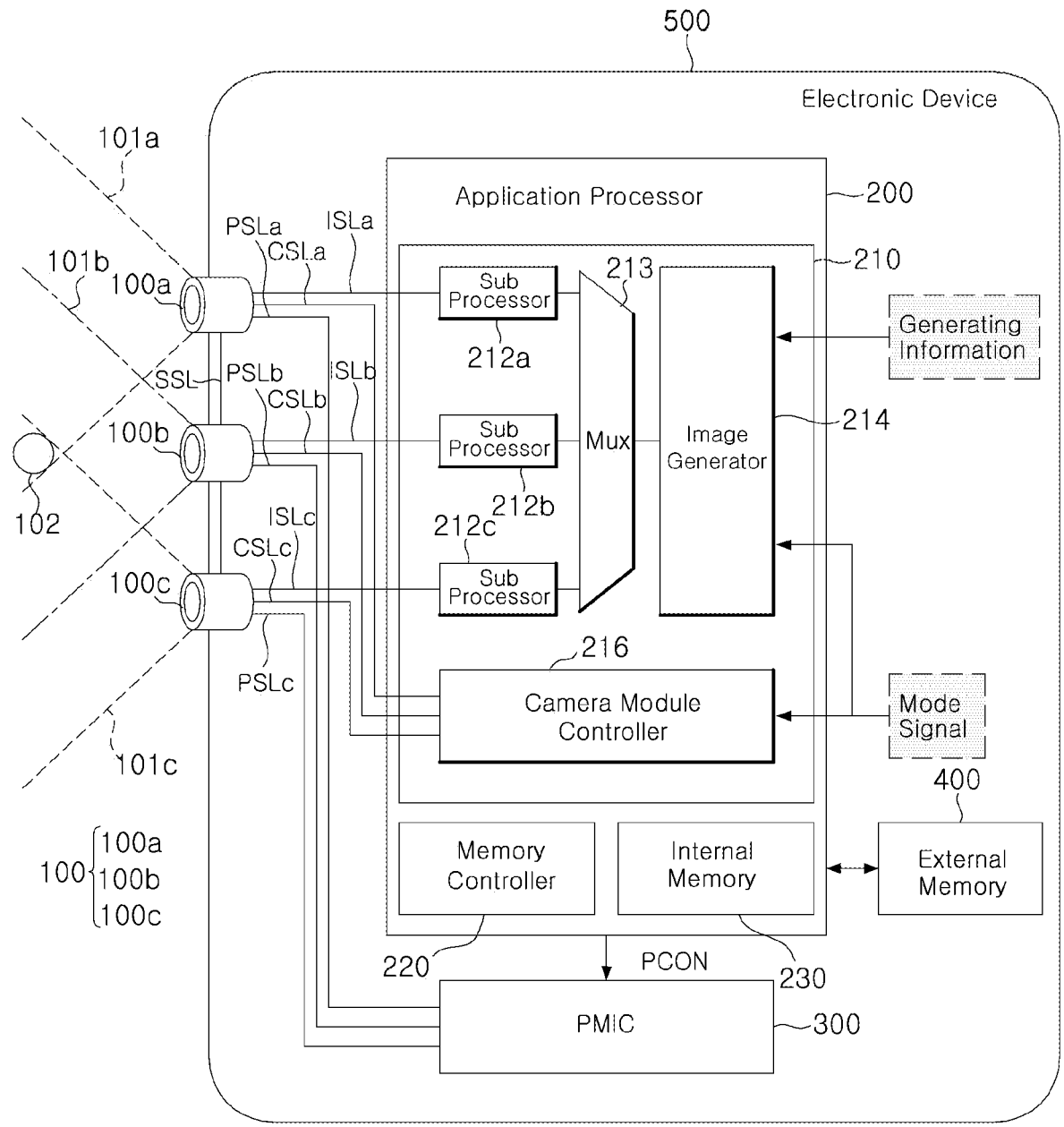
FIG. 1 is a block diagram illustrating a mobile electronic device including multi-camera modules according to some example embodiments of the present disclosure.

FIG. 1 is a block diagram illustrating a mobile electronic device including multi-camera modules, also referred to herein as simply "cameras," according to some example embodiments of the present disclosure.

Referring to FIG. 1, an electronic device 500 (also referred to interchangeably as a mobile electronic device) may include a camera module group 100, an application processor 200, a power management integrated circuit (PMIC 300) and an external memory 400. For example, the mobile electronic device may include a portable communication terminal, such as a smartphone or a tablet PC.

The camera module group 100 may include first to third camera modules 100a to 100c, also referred to herein as "cameras." In some example embodiments, the camera module group 100 is exemplified as having three camera modules 100a to 100c, but is not limited thereto. In some example embodiments, the camera module group 100 includes two camera modules (see FIG. 7) or n (where n is an integer of 4 or greater) camera modules.

At least two (for example, 100b and 100c) of the first to third camera modules 100a to 100c may have different fields of view. In this case, at least two camera modules (e.g., 100b and 100c) of the first to third camera modules 100a to 100c may have different optical lenses.

In some example embodiments, the fields of view of each of the first to third camera modules 100a to 100c may be different from each other. For example, the first camera module 100a may be a telephoto camera, and the second camera module 100b may be a wide camera, while the third camera module 100c is an ultrawide camera. In this case, optical lenses of a plurality of camera modules 100a to 100c may be different from each other.

In some example embodiments, one (e.g., 100b) of the first to third camera modules 100a to 100c may be a camera module in the form of a folded lens including a prism and an OPFE, while the remaining camera modules (e.g., 100a and 100c) may not include a prism and an OPFE and be a camera module in vertical form, but are not limited thereto, and may be implemented in different forms and by other combinations.

In some example embodiments, one (e.g., 100a) of the first to third camera modules 100a to 100c may be, for example, a depth camera in the vertical form configured to extract depth information using an infrared ray (IR). In this case, the application processor 200 merges image information received from such a depth camera and image information received from another camera module (e.g., 100b or 100c) to generate a 3D depth image. Such a merging process will be described in detail later with the image processor 210.

The first to third camera modules 100a to 100c employed in some example embodiments may be physically separated and disposed. Specifically, the first to third camera modules 100a to 100c may be independently disposed with an image sensor, instead of sharing and dividing a sensing region of a single image sensor. A portion of the image sensors of the first to third camera modules 100a to 100c may have a pixel array structure different from those of other portions.

Further, one of the first to third camera modules 100a to 100c may include a first image sensor having an RGB pixel array including or consisting of red pixels (R), green (G) pixels and blue (B) pixels, and the remaining modules may include an RGBW pixel array including or consisting of the RGB pixels and white (W) pixels. A red pixel may be configured to detect (e.g., absorb and/or photoelectrically convert) red light, a green pixel may be configured to detect (e.g., absorb and/or photoelectrically convert) green light, a blue pixel may be configured to detect (e.g., absorb and/or photoelectrically convert) blue light, and a white pixel may be configured to detect (e.g., absorb and/or photoelectrically convert) white light (e.g., some or all visible light).

In some example embodiments, the first and third camera modules 100a and 100c include an image sensor (e.g., CMOS image sensor, organic CMOS image sensor, or the like) having the RGB pixel array, while the second camera module 100b includes an image sensor (e.g., CMOS image sensor, organic CMOS image sensor, or the like) having the RGBW pixel array. For example, the first and third camera modules 100a and 100c may include the RGB pixel array having an RGB Bayer pattern illustrated in FIG. 2A, while the second camera module 100b may have the RGBW pixel array illustrated in FIG. 2B.

It will be understood that at least the first camera module 100a may be configured to obtain (e.g., generate, capture, etc.) a first image of a subject 102 in a first field of view 101a, where the first camera module 100a includes at least a first image sensor having an RGB array including or consisting of a first set of red (R) pixels, green (G) pixels and blue (B) pixels (collectively, RGB pixels). It will be understood that the second camera module 100b may be configured to obtain (e.g., generate, capture, etc.) a second image of a subject 102 (which may be the same or different from the aforementioned subject 102 in the first field of view 101a) in a second field of view 101b, where the second field of view 101b may be different from the first field of view 101a (e.g., wider than the first field of view), where the second camera module 100b includes at least a second image sensor having an RGBW array including or consisting of a second set of red (R) pixels, green (G) pixels, and blue (B) pixels (collectively, RGB pixels), and white (W) pixels. It will be understood that the third camera module 100c may be configured to obtain (e.g., generate, capture, etc.) a third image of a subject 102 (which may be the same or different from the aforementioned subject 102 in the first field of view 101a and/or in the second field of view 101b) in a third field of view 101c, where the third field of view 101c may be different from the first field of view 101a and/or the second field of view 101b (e.g., wider than the second field of view), where the third camera module 100c includes at least a third image sensor having a separate RGB array including or consisting of a third set of red (R) pixels, green (G) pixels, and blue (B) pixels (collectively, RGB pixels).

Figure 2A:
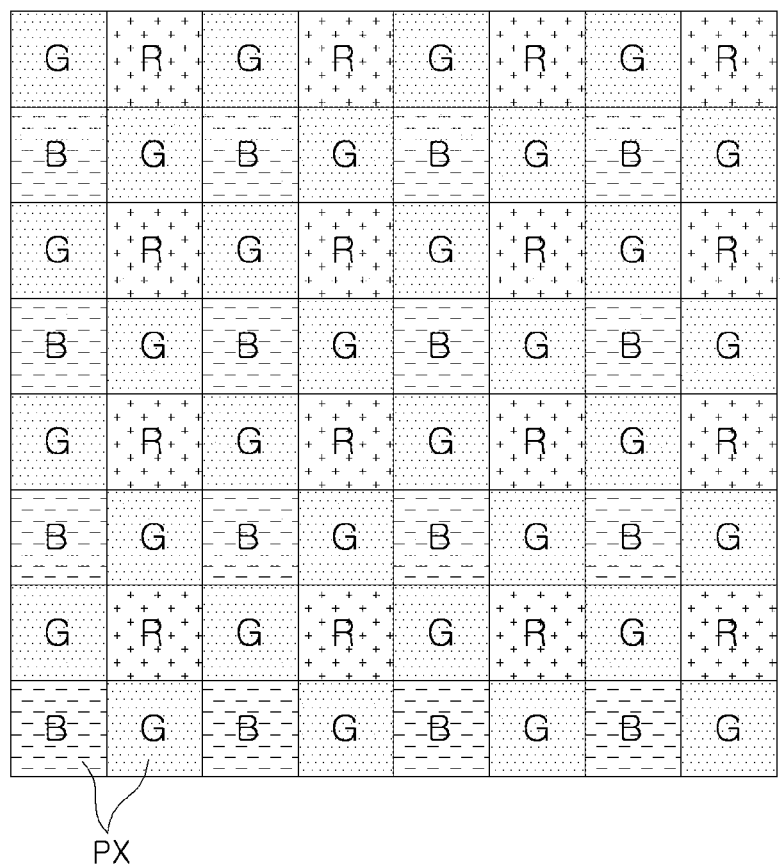
FIGS. 2A and 2B are planar views illustrating an example of a pixel array employed in first and second image sensors according to some example embodiments, respectively.
Figure 2B:
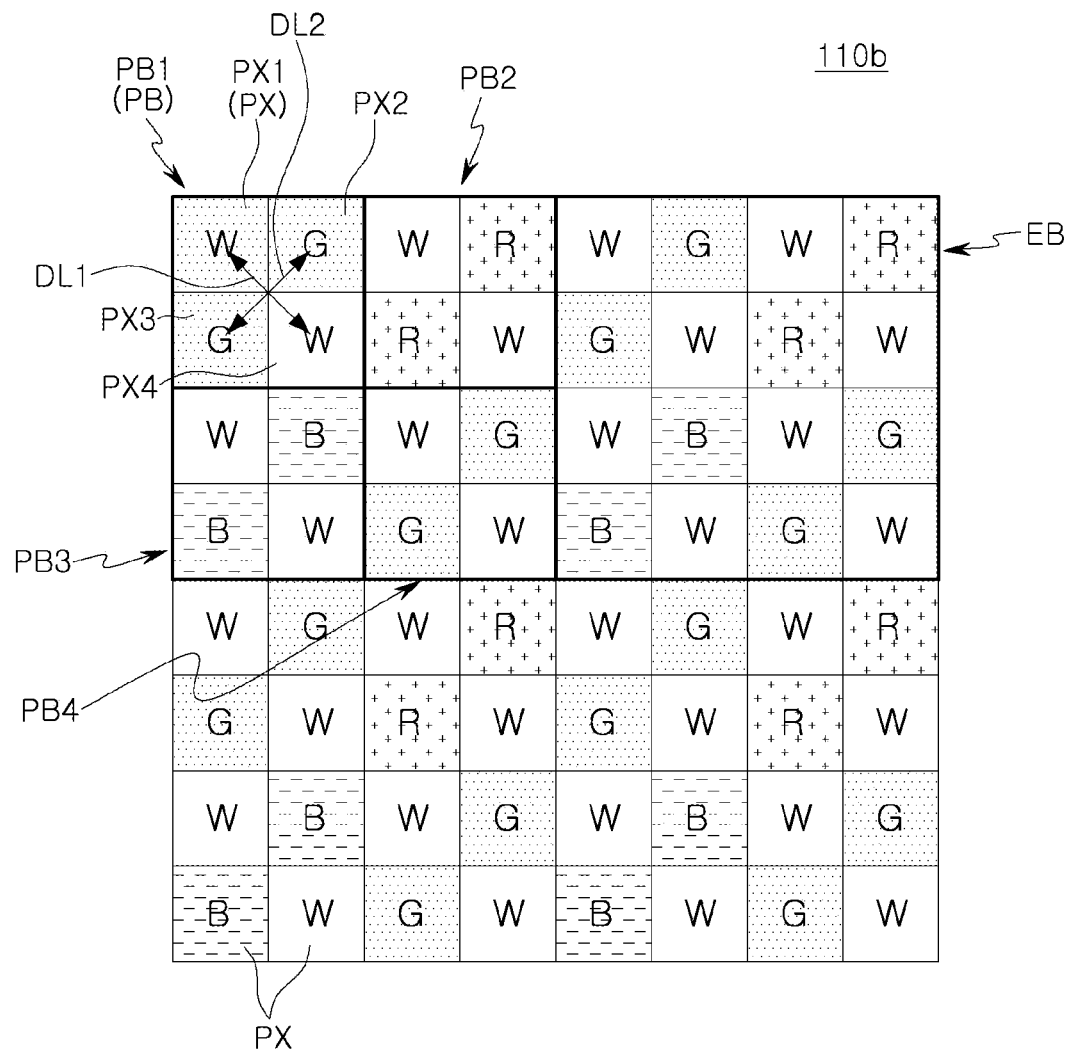

The RGBW pixel array 110b illustrated in FIG. 2B may further include the white (W) pixels in contrast to the RGB pixel array 110a illustrated in FIG. 2A.

The RGB pixel array 110a illustrated in FIG. 2A may be a Bayer pattern including or consisting of R-G-G-B pixels PX. In each R-G-G-B pixel, the green pixels are arranged in a first diagonal direction and the red and blue pixels are arranged in a second diagonal direction.

The RGBW pixel array 110b illustrated in FIG. 2B may include a plurality of extended Bayer pattern blocks EB having first to fourth pixel blocks PB1 to PB4 arranged in a 2×2 matrix. Each of the first to fourth pixel blocks PB1 to PB4 may include first to fourth pixels PX1 to PX4 arranged in a 2×2 matrix.

In each of the plurality of extended Bayer pattern block EB, the first and fourth pixel blocks PB1 and PB4 are arranged in the first diagonal direction DL1, and the second and third pixel blocks PB2 and PB3 are arranged in the second diagonal direction DL2.

In the first to fourth pixel blocks PB1 to PB4, the first and fourth pixels PX1 and PX4 in the first diagonal direction DL1 may be white (W) pixels configured to sense white light. In the first and fourth pixel blocks PB1 and PB4, the second and third pixels PX2 and PX3 in the second diagonal direction DL2 may be green (G) pixels configured to sense green light. In the second and third pixel blocks PB2 and PB3, the second and third pixels PX2 and PX3 in the second diagonal direction DL2 may be red and blue (R and B) pixels configured to sense red and blue light, respectively. In other example embodiments, the first to fourth pixel blocks PB1 to PB4 may be arranged in directions opposite to those of some example embodiments. For example, the first and fourth pixels PX1 and PX4 may be arranged in the second diagonal direction DL2 while the second and third pixels PX2 and PX3 may be arranged in the first diagonal direction DL1.

As the above, in some example embodiments, the second and third pixels PX2 and PX3 are provided as color pixels marked as R, G and B, and the first and fourth pixels PX1 and PX4 may be provided as illuminance-sensing pixels for improving sensitivity. Such illuminance-sensing pixels are configured to receive light in a broader bandwidth as compared to a wavelength bandwidth of the color pixels and may include, for example, yellow pixels in addition to the white (W) pixels.

As used herein, the expression "pixel block" refers to a unit in which a plurality of color pixels (e.g., PX2 and PX3) and a plurality of illuminance-sensing pixels (e.g., PX1 and PX4) are combined and arranged, and the expression "extended Bayer pattern block" refers to a unit in which four pixel blocks PB are arranged in a Bayer pattern. In some example embodiments, in view of the color pixels of the first to fourth pixel blocks PB1 to PB4, it may be understood that the extended Bayer pattern block EB implements the Bayer array pattern of R-G-G-B. In addition, Bayer pattern type color information BP1 illustrated in FIG. 6 may have a Bayer array pattern of R-G-G-B, corresponding to such a Bayer array.

If the image sensors of the first and third camera modules 100a and 100c have the RGB pixel arrays, and the image sensor of the second camera module 100b may have a pixel array additionally including the white (W) pixels, in addition to the pixel arrays illustrated in FIGS. 2A and 2B, the first and third camera modules 100a and 100c, in addition to the second camera module may employ another form of a pixel array.

Figure 3:
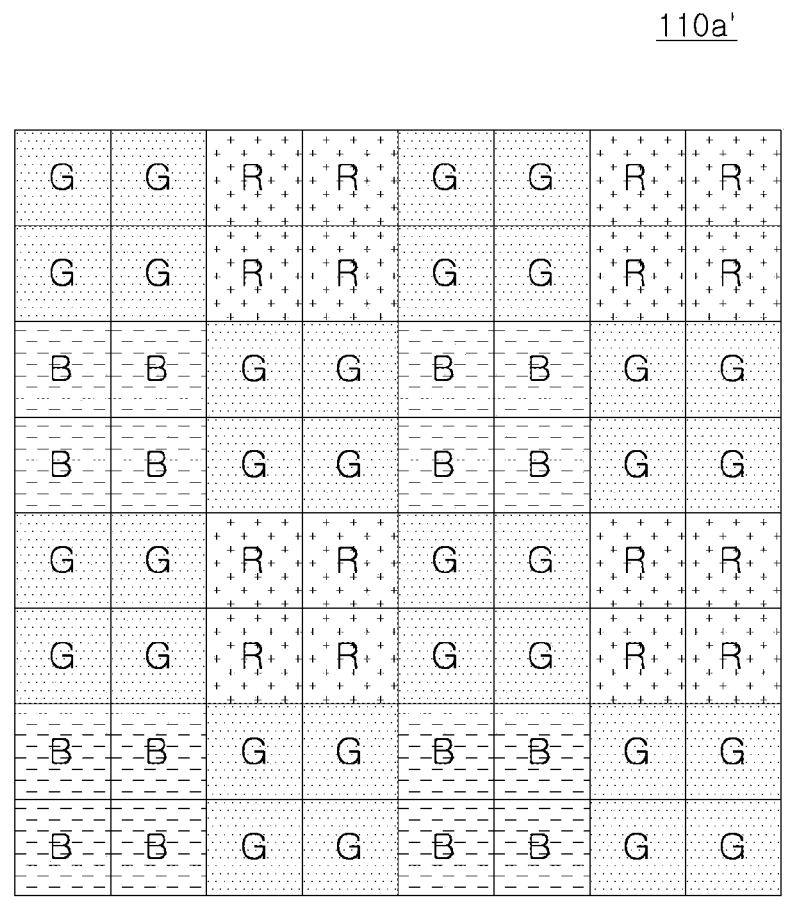

Referring to FIG. 3, the first and third camera modules 100a and 100c may have a pixel array 110a' of an extended Bayer pattern, called a Tetra pattern, as the RGB pixel array which can be employed therein. The pixel array 110a' of the extended Bayer pattern in FIG. 3 may be understood as a pixel array in which each pixel of the R-G-G-B Bayer pattern consists of 4 sub-pixels.

Figure 4:
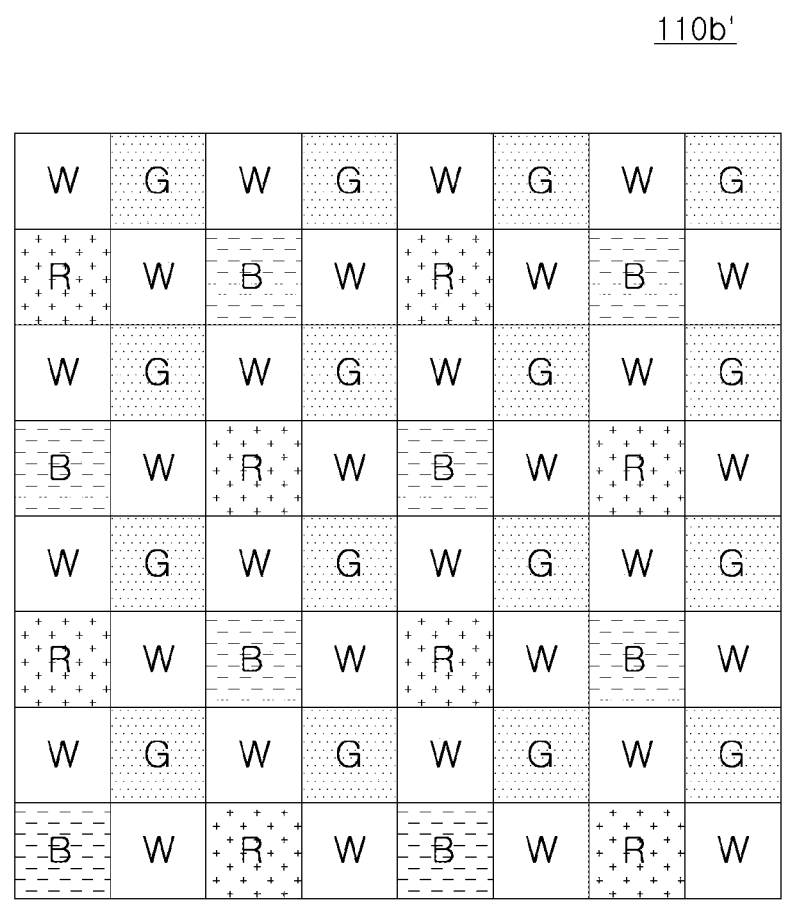

Meanwhile, referring to FIG. 4, an RGBW pixel array 110b', employed in the second camera module 100b has a different form of a pixel arrangement. In a first 4×4 pixel, two white pixels are arranged in a first diagonal direction, and red and green pixels are arranged in a second diagonal direction. In a second 4×4 pixel, two white pixels are arranged in the first diagonal direction, and blue and green pixels are arranged in the second diagonal direction. Such two 4×4 pixels may be alternately arranged in accordance with rows and columns thereof.

As the above, the RGBW pixel array, employed in the second camera module 100b, in addition to the RGB pixel array, employed in the first and third camera modules 100a and 100c may include various forms of pixel arrays.

Referring to FIG. 1 again, the application processor 200 may include an image processor 210, a memory controller 220 and an internal memory 230. The application processor 200 may be divided into the plurality of camera modules 100a to 100c and an additional semiconductor chip.

The image processor 210 may include first to third sub-image processors 212a to 212c, an image generator 214 and a camera module controller 216. The image processor 210 may include the first to third sub-image processors 212a to 212c in an amount corresponding to the amount of the first to third camera modules 100a to 100c.

As described herein, any of the electronic devices, including the electronic device 500, electronic device 500A, and/or any portions thereof (including, without limitation, the application processor 200, the image processor 210, the memory controller 220, the internal memory 230, any of the sub-image processors 212a to 212c, image generator 214, camera module controller 216, the PMIC 300, the external memory 400, and/or any of the camera modules 100a-100c of the camera module group 100, including binning unit 120, merging unit 140, any of the ADCs 150a, 150b, etc.) may include, may be included in, and/or may be implemented by one or more instances of processing circuitry such as hardware including logic circuits; a hardware/software combination such as a processor executing software; or a combination thereof. For example, the processing circuity more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., internal memory 230 and/or external memory 400), for example a solid state drive (SSD), storing a program of instructions, and a processor (e.g., image processor 210 or any portion thereof, memory controller 220, etc.) configured to execute the program of instructions to implement the functionality and/or methods performed by some or all of the electronic device 500, including the functionality and/or methods performed by some or all of the image processor 210, the image generator 214, the camera module controller 216, any of the sub-image processors 212a to 212c, the memory controller 220, the internal memory 230, the PMIC 300, the external memory 400, the application processor 200, any combination thereof, or the like.

Any of the memories described herein, including, without limitation, internal memory 230 and/or external memory 400 may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

Pieces of image data produced by the first camera module 100a (which may be generated at the first camera module 100a in response to capturing a first image of a subject in a first field of view are provided to the first sub-image processor 212a through an image signal line ISLa, and those produced by the second camera module 100b are provided to the second sub-image processor 212b through an image signal line ISLb. while those produced by the third camera module 100c are provided to the third sub-image processor 212c through an image signal line ISLc. Such a transfer of pieces of image data may be carried out, for example, using a camera serial interface (CSI) based on a mobile industry processor interface (MIPI).

Meanwhile, in some example embodiments, a plurality of sub-image processors corresponding to a plurality of camera modules may be implemented as a single sub-image processor. For example, the first to third sub-image processors 212a to 212c are illustrated as separated blocks but as a single combined sub-image processor in FIG. 1, and pieces of image data provided from the first and third camera modules 100a and 100c are selected by a multiplexor MUX 213, a selection component, and provided to a combined sub-image processor. The second sub-image processor 212b is not combined and may receive pieces of image data from the second camera module 100b (see FIGS. 5 and 6).

In some example embodiments, pieces of image data produced by the first camera module 100a are provided to the first sub-image processor 212a through an image signal line Isa, and those produced by the second camera module 100b are provided to a second sub-image processor 212b through an image signal line ISLb, while those produced by the third camera module 100c are provided to a third sub-image processor 212c through an image signal line ISLc. The pieces of image data processed in the second sub-image processor 212b are instantly provided to the image generator 214. With respect to those processed by the first and third sub-image processors 212a and 212c, however, one thereof is selected by the multiplexor MUX 213 and provided to the image generator 214.

Each of the first to third sub-image processors 212a to 212c can carry out image processing, such as bad pixel correction, 3A-corrections including auto-focus correction, auto-white valance and auto-exposure, noise reduction, sharpening, gamma control, remosaic, and the like, on the pieces of image data provided from the first to third camera modules 100a to 100c.

In some example embodiments, the remosaic signal processing is carried out in each camera module 100a to 100c and provided to the first to third sub-image processors 212a to 212c. Such pieces of image data processed in the first to third sub-image processors 212a to 212c may be provided to the image generator 214.

The image generator 214 can generate a target image using the pieces of image data received from the sub-image processor 212a to 212c in accordance with image generating information or a mode signal (e.g., a signal corresponding to a particular mode).

Specifically, the image generator 214 may merge some of the pieces of image data produced from the sub-image processors 212a to 212c to generate an output image, in accordance with the image generating information or a mode signal. In some example embodiments, the image generator 214 may select any one of the pieces of image data produced from the first to third sub-image processors 212a to 212c to generate a target image. Such a mode includes a plurality of various modes and can be selected by a user or an external environment. Such modes may include operation modes, or modes of operation of the electronic device 500, which may be selected and executed from to control the operation of some or all of the electronic device (e.g., control the generation of a target image by the electronic device 500 based on image(s) captured by one or more camera modules 100a to 100c). Accordingly, the image processor 210 may generate a target image, using at least one of the first image captured by the first camera module 100a (and thus using image data produced from the first sub-image processor 212a), the second image captured by the second camera module 100b (and thus using image data produced from the second sub-image processor 212b), or the third image captured by the third camera module 100c (and thus using image data produced from the third sub-image processor 212c) in accordance with a mode selected from a plurality of modes (such a mode selected from a plurality of modes being referred to herein interchangeably as a "selected mode" of the plurality of modes). In some example embodiments, a mode may be selected from a plurality of modes and a target image may be generated in accordance with a selected mode based on one or more portions of the application processor 200 (e.g., image processor 210) executing a program of instructions stored in one or more devices (e.g., internal memory 230, external memory 400, or the like) and/or in response to a signal received at the application processor (e.g., a mode signal and/or generating information).

The plurality of various modes controls not only the image generator 214 but also the first to third camera modules 100a to 100c through the camera module controller 216. A control signal provided to the first to third camera modules 100a to 100c from the camera module controller 216 may include information according to a selected mode.

The mode employed in some example embodiments include a plurality of still image modes and a plurality of video modes, and a multicamera (e.g., camera module group 100) of the electronic device 500 according to some example embodiments may operate differently depending on a signal of the selected mode (e.g., the image processor 210 may be configured to control the first to third camera modules 100a to 100c according to a signal of the selected mode (which signal the image processor 210 may generate and transmit to control one or more camera modules according to the selected mode).

In some example embodiments, the plurality of modes may include first to third still image modes (e.g., a plurality of still image modes, also referred to as modes to control the generation of one or more still images) and first and second video modes (e.g., a plurality of video modes, also referred to as modes to control the generation of one or more videos). Such plurality of modes can be described as an operation (particularly, output, such as image data) of the second camera module 100b, a wide camera, due to a corresponding control signal. As previously described, the second camera module 100b, unlike the first and third camera modules 100a and 100c, may include an image sensor having the RGBW pixel array.

Each mode, of the plurality of still image modes and the plurality of video modes, may be configured to control an output of at least the second camera module 100b under a condition in which at least one of an output speed (e.g., frames per second, or "fps") at which pieces of pixel data are converted into a digital signal at the second camera module 100b and/or at which image data is transmitted by the second camera module 100b or a bit depth (e.g., a quantity of bits used to indicate a color of a pixel of a captured image) of image data output (e.g., transmitted, generated, etc.) by the second camera module 100b is different. Restated, the plurality of still image modes and the plurality of video modes may be associated with separate, respective (e.g., different) combinations of output speed and/or bit depth, and the image processor 210 may adjustably control an output of (e.g., image data generated by) the second camera module 100b (e.g., at least one of the output speed or the bit depth associated with said output) according to a selected mode of the plurality of modes such that the output has a particular (e.g., different) output speed and/or bit depth based on the selected mode of the plurality of modes. In some example embodiments, the plurality of still image modes may include first to third still image modes. In some example embodiments, the plurality of video modes may include first and second video modes.

Figure 5:
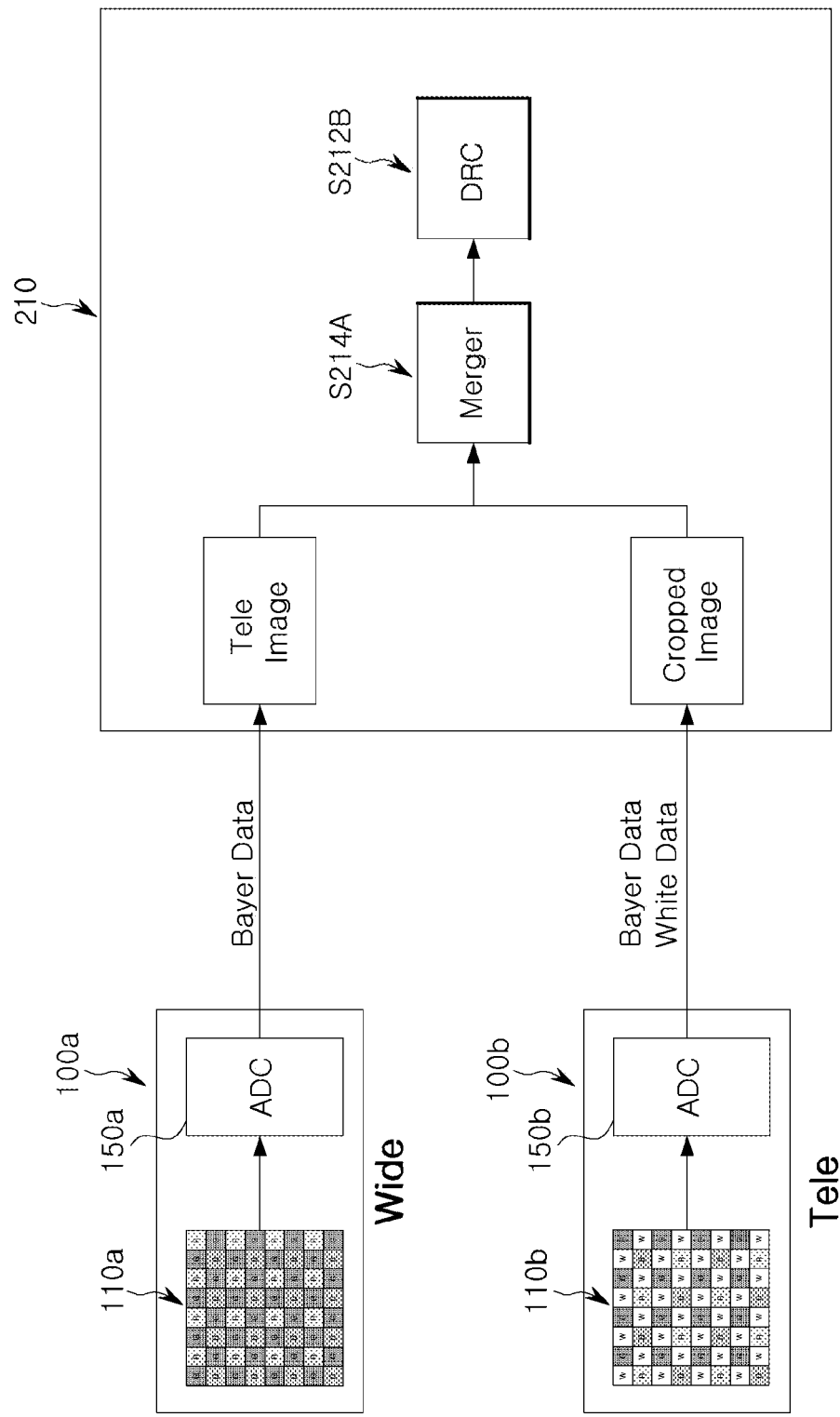
FIG. 5 is a block diagram illustrating a process of creating an image according to an example of an image capture mode employed in some example embodiments.

In the case of the first still image mode (e.g., when the second camera module 100b is controlled according to the first still image mode), the second camera module 100b may transfer pieces of pixel data converted into a digital signal through an analog-digital converter (ADC) 150b at a first output speed (e.g., A fps) and a first bit depth to the application processor 200 (see FIG. 5). Restated, the image processor 210 may be configured to control the second camera module 100b according to the first still image mode to cause the second camera module to deliver pieces (e.g., units) of pixel data (e.g., image data) corresponding to one or more second images captured by the second camera module 100b to the image processor 210 at a first output speed (e.g., 60 fps) and a first bit depth (e.g., 10 to 14 bits).

In the case of the second still image mode, the second camera module 100b can transfer pieces of pixel data converted into a digital signal through the ADC 150b at a second output speed (e.g., B fps) and a second bit depth to the application processor 200 (see FIG. 5). Restated, the image processor 210 may be configured to control the second camera module 100b according to the second still image mode to cause the second camera module to deliver pieces (e.g., units) of pixel data (e.g., image data) corresponding to one or more second images captured by the second camera module 100b to the image processor 210 at a second output speed (e.g., 90 fps) and a second bit depth (e.g., 11 to 14 bits). The second output speed may be the same as or different from (e.g., greater or smaller than) the first output speed. The second bit depth may be the same as or different from (e.g., greater or smaller than) the first bit depth. Similarly thereto, in the third still image mode, the second camera module 100b can transfer pieces of pixel data at a third output speed (e.g., C fps) and a third bit depth to the application processor 200. Restated, the image processor 210 may be configured to control the second camera module 100b according to the third still image mode to cause the second camera module to deliver pieces (e.g., units) of pixel data (e.g., image data) corresponding to one or more second images captured by the second camera module 100b to the image processor 210 at a third output speed (e.g., 120 fps) and a third bit depth (e.g., 11 or more bits). The third output speed may be the same as or different from (e.g., greater or smaller than) the first and/or second output speeds. The third bit depth may be the same as or different from (e.g., greater or smaller than) the first and/or second bit depths. In some example embodiments, the second and third output speeds may both be greater than (e.g., faster than) the first output speed, and the third output speed may be greater than (e.g., faster than) the second output speed. For example, the first and second bit depths may be in the range of 10 to 14 or 11 to 14, and the third bit depth may be 11 or greater. In some example embodiments, the respective bit depths of the first to third still image modes (e.g., first, second, and/or third bit depths) are within a range of 11 to 13 bits. In some example embodiments, the first, second, and/or third bit depths are within a range of 11 to 14 bits. The units of bit depth as described herein may be quantities of bits (e.g., 10 to 14 bits, 11 to 14 bits, 11 or more bits, etc.). In some example embodiments, the first and second bit depths may both be within a range of 11 to 14 bits. In some example embodiments, the first bit depth is within a range of 11 to 14 bits. In some example embodiments, the second bit depth is within a separate range of greater than 11 bits. In some example embodiments, the bit depth of the pieces of pixel data of the first camera module 100a (e.g., bit depth of pieces of pixel data included in image data output by the first camera module 100a to the application processor 200) is 10 or fewer bits.

The bit depths according to the plurality of modes may be improved through image processing using pieces of RGBW pixel data output from the second camera module 100b. For example, the bit depth may be determined by whether binned pieces of white data of the second camera module 100b are merged and/or a HDR function using a dual conversion gain (DCG) is applied. The modes may include control signals for merging of the pieces of white data and/or HDR function application depending on a desired bit depth.

The binned pieces of white data from the second camera module 100b are controlled to be merged to the pieces of RGB color data of the first or third camera module 100a or 100c, and through such merging, quality is improved and a desired bit depth is obtained depending on the selected mode.

In some example embodiments, the image processor 210 may control the second camera module 100b according to at least one of the first, second, or third still image modes (e.g., the third still image mode and not the first still image mode or second still image mode) to deliver the pieces of pixel data to the image processor 210 by binning as pieces of RGB color data and pieces of white (W) data. In some example embodiments, the image processor 210 may control the second camera module 100b according to the first still image mode and/or the second still image mode (e.g., at least one of the first still image mode or the second still image mode) to deliver the pieces of pixel data to the image processor 210 as pieces of RGBW color data without binning.

In some example embodiments, in the third still image mode, the pieces of RGB color data and the pieces of white data are binned to deliver to the application processor. Restated, the image processor 210 may control the second camera module 100b according to the third still image mode to implement binning of the pieces of RGB color data and the pieces of white data to deliver to the application processor 200 as the image data. In the first and second still image modes, the pieces of RGB color data were converted into a Bayer pattern to deliver to the application processor 200 (e.g., without binning).

Specifically, referring to FIG. 6, pieces of RGBW pixel data (2m×2n pixel) obtained from the RGBW pixel array 110*b* are binned to pieces of white data and pieces of RGB color data BP1, which are m×n pixels, through a binning unit 120, and outputting of the second camera module 100*b* may be controlled as below depending on the selected mode.

In the third still image mode, the binned pieces of data (particularly pieces of white data BP2) are converted in the ADC 150*b* and transferred to the application processor 200 from the second camera module 100*b*. The transferred pieces of white data BP2 may be merged with the pieces of RGB color data transferred to the application processor 200 from the first or third camera module 100*a* or 100*c*. In this case, the first camera module 100*a* (e.g., a telephoto camera module) or the third camera module 100*c* (e.g., an ultrawide camera module) may be selected depending on a zoom mode. Such merging enables a dark portion in the pieces of RGB color data of the first or third camera module 100*a* or 100*c* to be corrected to be bright and the RGB color transferred from the second camera module 100*b* itself to have corrected quality.

In FIG. 5, the image processor 210 carrying out such merging is schematically illustrated as a related functional block. In the third still image mode, the pieces of white data (BP2 of FIG. 6) from the second camera module 100*b*, a wide camera, and the pieces of RGB color data (e.g., Bayer pattern; marked as "telephoto image") from the first camera module 100*a*, a telephoto camera, are transferred to the image processor, and a region of the pieces of white data, corresponding to the pieces of RGB color data, is obtained as a cropped image (marked as "cropped image"). In a merging unit S214A, the cropped data obtained from the pieces of white data (BP2 of FIG. 6) obtained from the second camera module 100*b* and the pieces of RGB color data obtained from the first camera module 100*a* are merged, compression is carried out on the RGB pixel data merged through a dynamic range compression (DRC) unit S212B without a loss of a dynamic range, thereby providing an image having improved quality according to the third still image mode. The DRC unit S212B and the merging unit S214A may be implemented by one or more portions of the image processor 210, including the image generator 214, the multiplexor MUX 213, one or more of the sub-image processor 212*a* to 212*c*, camera module controller 216, any combination thereof, or the like.

For example, the pieces of white data BP2 and the pieces of RGB color data BP1, such as a Bayer pattern, output from the second camera module 100*b* may have a bit depth (e.g., 14 bit/12 bit), greater than the bit depth (e.g., 10 bit) of the pieces of RGB color data, such as a Bayer pattern, output from the first camera module 100*a*. As a result, a target image according to the third still image mode may be improved to have a comparatively greater big depth (e.g., 11 bit or greater).

Figure 6:
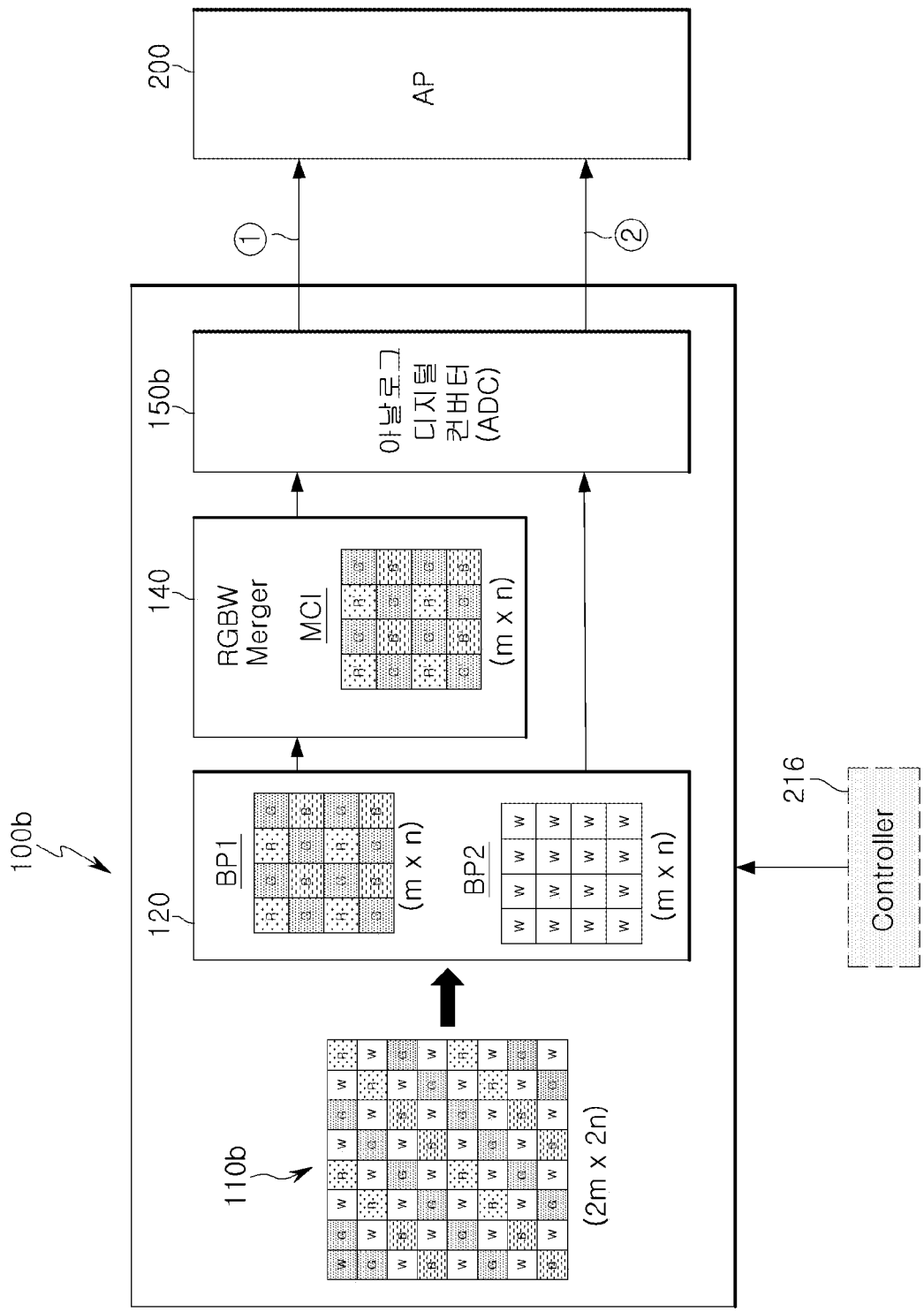
FIG. 6 is a block diagram illustrating a second image sensor of a mobile electronic device according to some example embodiments.

As the above, in the first and second still image mode, the pieces of RGBW pixel data are binned, and the pieces of binned RGB color data BP1 and pieces of white data BP2 are merged with the pieces of RGB color data MC1 in the RGBW merging unit 140 as illustrated in FIG. 6, and converted into a digital signal through the ADC 150*b* to transfer to the image processor 210 (marked ①). In contrast, in the third still image mode, the second camera module 100*b* bins the 2m×2n pieces of RGBW pixel data as the pieces of RGB color data BP1 and the pieces of white data BP2 through the binning unit 120 and transfers the same to the image processor 210 through the ADC 150*b* without merging by the RGBW merging unit 140 (marked ②).

Meanwhile, the bit depth may be determined by applying an HDR function using the DCG. A desired bit depth can be determined by whether to apply the HDR function according to the mode selection. The HDR function may improve image quality by using frames captured with first and second conversion gains under different conditions. For example, a high conversion gain (HCG) and a low conversion gain (LCG), which may be different from each other, are automatically selected according to an amount of light under two conditions, thereby enhancing color expression and minimizing noise. These conditions can be obtained, for example, by varying an exposure time.

In some example embodiments, in at least one of the first, second, or third still image modes (e.g., in the second still image mode and the third still image mode and not the first still image mode), the HDR function may be implemented using an image captured with the HCG and an image captured with the LCG. These HCG and LCG can be implemented by turning on/off an LCG switch described in US Patent Publication No. 2015-0021459, herein incorporated by reference in its entirety (see FIG. 1 in particular). In contrast, the HDR function may not be supported (e.g., may not be implemented/applied) in the first still image mode.

In some example embodiments, the plurality of video modes may include first and second video modes, and output of the second camera module 100*b* may be differently controlled by the first and second video modes.

In the case of the first video mode, the second camera module 100*b* transfers pixel data converted into a digital signal through the ADC (150*b* in FIG. 5) at a fourth output speed (e.g., D fps) and a fourth bit depth to the application processor 200. Restated, the image processor 210 may control the second camera module 100*b* according to the first video mode to cause the second camera module 100*b* to deliver pieces of pixel data to the image processor 210 at a fourth output speed and a fourth bit depth.

In the case of the second video mode, the second camera module 100*b* transfers pixel data converted into a digital signal through the ADC (150*b* in FIG. 5) at a fifth output speed (e.g., E fps) and a fifth bit depth to the application processor 200. Restated, the image processor 210 may control the second camera module 100*b* according to the second video mode to cause the second camera module 100*b* to deliver pieces of pixel data to the image processor 210 at a fifth output speed and a fifth bit depth. For example, the fifth output speed may be faster than the fourth output speed. For example, the fifth bit depth may be greater than the fourth bit depth. In some example embodiments, the HDR function described above may be supported in the second video mode. Restated, in the at least one of the first video mode or the second video mode (e.g., the second video mode and not the first video mode), a high dynamic range (HDR) function employing combining frames captured as first and second conversion gains, different from each other, is applied, and in at least one of the first video mode or the second video mode (e.g., the first video mode and not the second video mode), the HDR function is not applied. Further restated, in the second video mode, a high dynamic range (HDR) function is implemented based on combining an image captured with a first conversion gain and another image captured with a second conversion gain that is different from the first conversion gain, and in the first video mode, the HDR function is not implemented. For example, the fourth and fifth bit depths may be 12 or 13 bits. In some example embodiments, a bit depth of the first video mode may be within a range of 11 to 13 bits.

In some example embodiments, the second camera module, a wire camera, may bin and process pieces of RGB color data and pieces of white W data using an RGBW pixel array. In this case, exposure times for the RGB pixel and the white (W) pixel may be set to be the same. In some example embodiments, however, the exposure time of the RGB pixel and the W pixel may be set differently (e.g., 1:2, 1:4). For example, in at least one of the first video mode or the second video mode (e.g., the second video mode and not the first video mode), the pieces of pixel data of the second camera module 100b may be delivered to the image processor 210 by binning as pieces of RGB color data and pieces of white (W) data, and in the first video mode, the pieces of pixel data of the second camera module 100b may be delivered to the image processor 210 as pieces of RGBW color data without binning. Restated, the image processor 210 may control the second camera module 100b according to at least one of the first video mode or the second video mode (e.g., the second video mode and not the first video mode) to deliver the pieces of pixel data of the second camera module 100b to the image processor 210 by binning as pieces of RGB color data and pieces of white (W) data, and the image processor may be configured to control the second camera module 100b according to at least one of the first video mode or the second video mode (e.g., the first video mode and not the second video mode) to deliver the pieces of pixel data to the image processor 210 as pieces of RGBW color data without binning.

Meanwhile, the image generation information may include, for example, a zoom signal or a zoom factor. Such a zoom signal may be, for example, a signal selected from a user.

In the case in which the image generation information is a zoom signal (or a zoom factor) and the first to third camera modules 100a to 100c have different fields of view (or angles of view), the image generator 214 may perform different operations according to a type of the zoom signal.

For example, when the zoom signal is a first signal, an output image can be generated using pieces of image data output from the first sub-image processor 212a, among the pieces of image data output from the first sub-image processor 212a and that output from the third sub-image processor 212c, and pieces of image data output from the second sub-image processor 212b.

When the zoom signal is a second signal, which is different from the first signal, the image generator 214 can generate an output image using the pieces of image data output from the third sub-image processor 212c, among the pieces of image data output from the first sub-image processor 212a and that output from the third sub-image processor 212c, and the pieces of image data output from the second sub-image processor 212b.

When the zoom signal is a third signal, the image generator 214 does not merge pieces of image data and select any one of the pieces of image data output form the sub-image processors 212a to 212c to generate an output image. In addition to the above described crating process, pieces of image data processing can be performed using variously modified methods with other creating processes depending on other zoom signals.

A camera control signal according to the mode selection may be provided to each of the camera modules 100a to 100c by the camera module controller 216. A control signal generated from the camera module controller 216 may be provided to corresponding first to third camera modules 100a to 100c through control signal lines CSLa, CSLb and CSLc separated from each other.

Meanwhile, any one of the first to third camera modules 100a to 100c is designated as a master camera (e.g., 100b) according to image generation information or a mode including a zoom signal, and the remaining camera modules (e.g., 100a and 100c) may be designated as slave cameras. Such information is included in the control signal and provided to the corresponding first to third camera modules 100a to 100c through the control signal lines CSLa, CSLb, and CSLc separated from each other.

The PMIC 300 may supply power, such as a power voltage, to each of the first to third camera modules 100a to 100c. For example, the PMIC 300 supplies first power to the first camera module 100a through a power signal line PSLa under control of the application processor 200, second power to the second camera module 100b through a power signal line PSLb, and third power to the third camera module 100c through a power signal line PSLc.

The PMIC 300 generates power corresponding to each of the first to third camera modules 100a to 100c in response to a power control signal PCON from the application processor 200 and also adjusts a level of power. The power control signal PCON may include a power adjustment signal for each operation mode of the plurality of camera modules 100a to 100c. For example, an operation mode may include a low power mode, and in this case, the power control signal PCON may include information on a camera module operating in a low power mode and on a set power level. The level of power provided to each of the first to third camera modules 100a to 100c may be the same or different from each other or may be dynamically changed.

Figure 7:
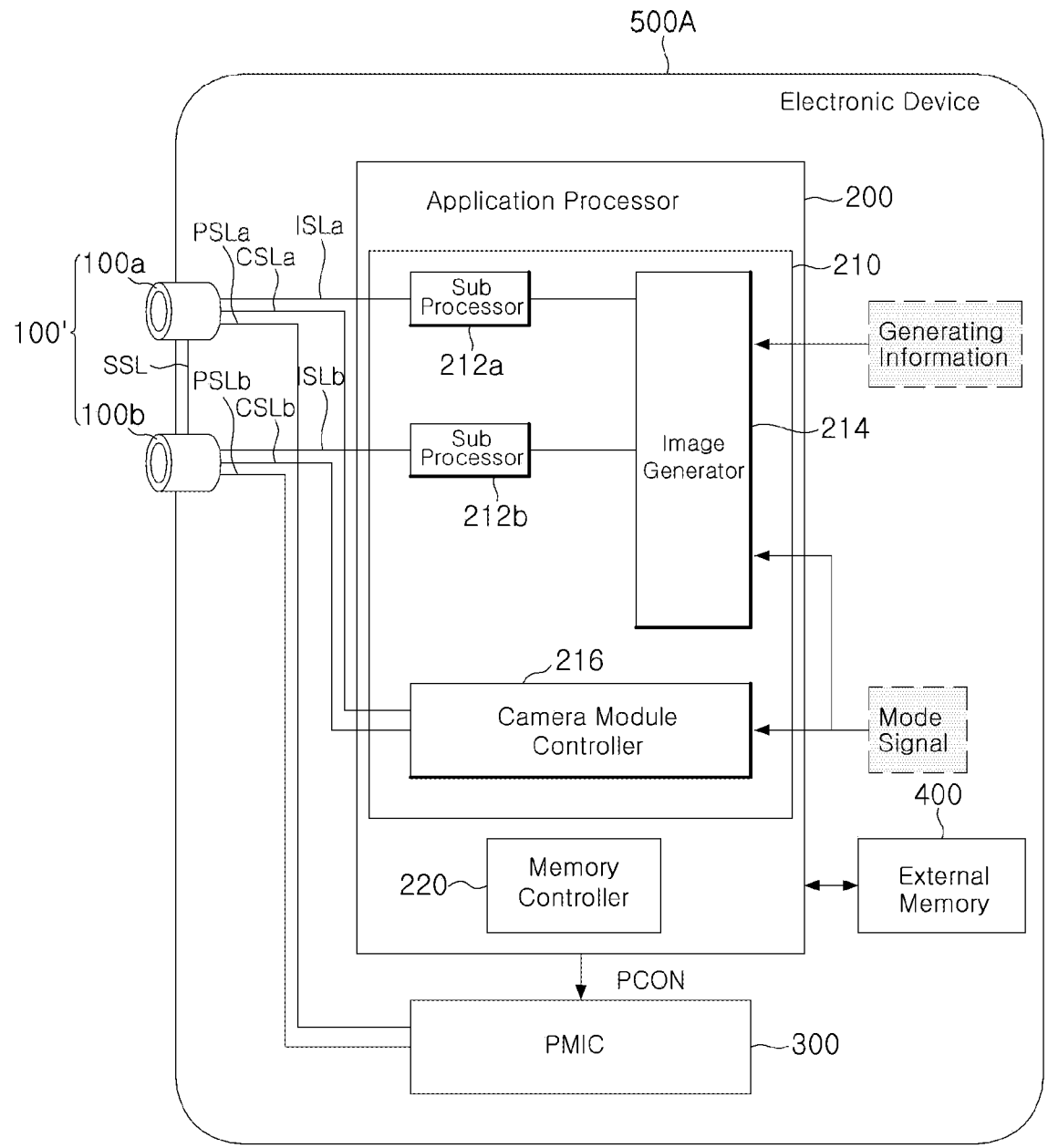
FIG. 7 is a block diagram illustrating a mobile electronic device including multi-camera modules according to some example embodiments.

FIG. 7 is a block diagram illustrating a mobile electronic device including multi-camera modules according to some example embodiments.

Referring to FIG. 7, an electronic device 500A (also referred to interchangeably as a mobile electronic device) according to some example embodiments includes two camera modules 100a and 100b and can be understood as being similar to the electronic device 500 of FIG. 1 except that some configurations (e.g., a selection unit, an internal memory) are omitted. In addition, unless otherwise specified, components of some example embodiments may be understood with reference to the descriptions of the same or similar components of the electronic device 500 described in FIGS. 1 to 6.

A camera module group 100' employed in some example embodiments may include two camera modules, that is, first and second camera modules 100a and 100b. The first and second camera modules 100a and 100b may have different angles of view. In some example embodiments, optical lenses of the first and second camera modules 100a and 100b may be different from each other. For example, the first camera module 100a may be a telephoto camera, and the second camera module 100b may be a wide camera.

The first camera module 100a includes an image sensor having a color pixel array which receives color (e.g., RGB), and the second camera module 100b may include an image sensor having an RGBW pixel array in which white pixels for illuminance-sensing pixels are combined to improve sensitivity. From pieces of image data obtained by controlling output of the second camera module 100b, a dynamic range DR of a target image output from the RGB pixel array of another camera module may be variously extended. This image quality improvement resolution may be implemented in the plurality of modes controlling output conditions (e.g., output speed, bit depth, or the like) of the RGBW pixel array.

Similarly to the above-described embodiments, the plurality of modes may include a plurality of still image modes and a plurality of video modes. For example, the bit depth may be determined by whether to merge RGBW and/or whether to apply the HDR function. These various modes may be automatically determined by the user's selection or an ambient surrounding environment (e.g., an optical sensor sensing external illuminance).

In contrast to the electronic device 500 illustrated in FIG. 1, the electronic device 500A according to some example embodiments may be configured by omitting or adding some components. For example, as illustrated in FIG. 7, the configuration corresponding to the selection unit (e.g., multiplexor MUX 213 in FIG. 1) may be omitted, the internal memory 230 is omitted or replaced with an external memory 400 of the electronic device 500A located outside the application processor 200. Meanwhile, the electronic device 500A according to some example embodiments may further include various components not illustrated. For example, in order to automatically perform mode selection according to the ambient environment, an optical sensor and a distance measurement sensor capable of detecting external conditions (e.g., illuminance or distance to a subject) may be further included.

As set forth above, in some example embodiments, a portion of camera modules, among the multi-camera modules, composes an RGBW pixel array, in which color pixels receiving colors (e.g., RGB) and illuminance sensing pixels (e.g., white) for improving sensitivity are combined, and uses the same to variously expand a dynamic band (DR) of an image output from an RGB pixel array of another camera module. This image quality improvement resolution may be implemented in the plurality of modes controlling output conditions (e.g., output speed, bit depth, or the like) of the RGBW pixel array. For example, the bit depth may be determined by whether to merge the pieces of RGBW pixel data and/or whether to apply an HDR function.

Various advantages and beneficial effects of the present disclosure are not limited to the above descriptions and may be easily understood in the course of describing various example embodiments.

While some example embodiments have been shown and described above, it will be apparent to those skilled in the art that modifications and variations could be made without departing from the scope of the present inventive concepts as defined by the appended claims.

What is claimed is:

1. A mobile electronic device, comprising:
a first camera configured to capture a first image of a subject in a first field of view, the first camera including a first image sensor having an RGB array including red (R) pixels, green (G) pixels and blue (B) pixels and excluding white (W) pixels;
a second camera configured to capture a second image of the subject in a second field of view, the second field of view being different from the first field of view, the second camera including a second image sensor having an RGBW array including red (R) pixels, green (G) pixels, blue (B) pixels, and white (W) pixels; and
an image processor, wherein a plurality of modes includes a plurality of still image modes including a first still image mode and a second still image mode and a plurality of video modes, the plurality of still image modes and the plurality of video modes associated with separate, respective combinations of output speed and bit depth such that the image processor is configured to control an output of the second camera to have a different combination of output speed and bit depth based on a selected mode, and wherein
the image processor is configured to control the second camera according to the second still image mode to deliver pieces of pixel data to the image processor by binning as pieces of RGB color data and pieces of white (W) data, and
the image processor is configured to control the second camera according to the first still image mode to deliver pieces of pixel data to the image processor as pieces of RGBW color data without binning.

2. The mobile electronic device of claim 1, wherein
the image processor is configured to control the second camera according to the first still image mode to cause the second camera to deliver pieces of pixel data corresponding to one or more second images captured by the second camera to the image processor at a first output speed and a first bit depth, and
the image processor is configured to control the second camera according to the second still image mode to cause the second camera to deliver the pieces of pixel data corresponding to the one or more second images captured by the second camera to the image processor at a second output speed and a second bit depth, the second bit depth being greater than the first bit depth.

3. The mobile electronic device of claim 2, wherein,
in the second still image mode, a high dynamic range (HDR) function is implemented based on combining an image captured with a first conversion gain and another image captured with a second conversion gain that is different from the first conversion gain, and
in the first still image mode, the HDR function is not implemented.

4. The mobile electronic device of claim 2, wherein the second output speed is greater than the first output speed.

5. The mobile electronic device of claim 2, wherein
a bit depth of pieces of pixel data of the first camera is 10 or fewer bits, and
the first and second bit depths are both within a range of 11 to 14 bits.

6. The mobile electronic device of claim 2, wherein
the plurality of still image modes further comprises a third still image mode,
the image processor is configured to control the second camera according to the third still image mode to cause the second camera to deliver the pieces of pixel data corresponding to the one or more second images captured by the second camera to the image processor at a third output speed and a third bit depth, the third bit depth being different from both the first bit depth and the second bit depth.

7. The mobile electronic device of claim 6, wherein,
the image processor is configured to control the second camera according to the second still image mode to deliver the pieces of pixel data of the second camera to the image processor by binning as pieces of RGB color data and pieces of white (W) data, and
the image processor is configured to control the second camera according to at least one of the first still image mode or the second still image mode to deliver the pieces of pixel data to the image processor as pieces of RGBW color data without binning.

8. The mobile electronic device of claim 6, wherein,
in the second and third still image modes, a high dynamic range (HDR) function is implemented based on combining an image captured with a first conversion gain and another image captured with a second conversion gain that is different from the first conversion gain, and in the first still image mode, the HDR function is not implemented.

9. The mobile electronic device of claim 6, wherein the second and third output speeds are both faster than the first output speed, and the third output speed is faster than the second output speed.

10. The mobile electronic device of claim 6, wherein a bit depth of pieces of pixel data of the first camera is 10 or fewer bits, the first bit depth is within a range of 11 to 14 bits, and the second bit depth is within a separate range of greater than 11 bits.

11. The mobile electronic device of claim 1, wherein the plurality of video modes includes a first video mode and a second video mode, the image processor is configured to control the second camera according to the first video mode to cause the second camera to deliver pieces of pixel data to the image processor at a first output speed and a first bit depth, and the image processor is configured to control the second camera according to the second video mode to cause the second camera to deliver the pieces of pixel data to the image processor at a second output speed and a second bit depth, the second output speed being faster than the first output speed, the second bit depth being greater than the first bit depth.

12. The mobile electronic device of claim 11, wherein, the image processor is configured to control the second camera according to the second video mode to deliver the pieces of pixel data of the second camera to the image processor by binning as pieces of RGB color data and pieces of white (W) data, and the image processor is configured to control the second camera according to the first video mode to deliver the pieces of pixel data to the image processor as pieces of RGBW color data without binning.

13. The mobile electronic device of claim 11, wherein, in the second video mode, a high dynamic range (HDR) function is implemented based on combining an image captured with a first conversion gain and another image captured with a second conversion gain that is different from the first conversion gain, and in the first video mode, the HDR function is not implemented.

14. The mobile electronic device of claim 11, wherein a bit depth of pieces of pixel data of the first camera is 10 or fewer bits, and the first and second bit depths are within a range of 11 to 13 bits.

15. A mobile electronic device, comprising:

a first camera configured to capture a first image of a subject in a first field of view, the first camera including a first image sensor having an RGB array including red (R) pixels, green (G) pixels and blue (B) pixels and excluding white (W) pixels;

a second camera configured to capture a second image of the subject in a second field of view, the second field of view being wider than the first field of view, the second camera including an RGBW array including red (R) pixels, green (G) pixels, blue (B) pixels, and white (W) pixels;

a third camera configured to capture a third image of the subject in a third field of view, the third field of view being wider than the second field of view, the third camera including a third image sensor having a separate RGB array including red (R) pixels, green (G) pixels, and blue (B) pixels; and an image processor configured to generate a target image using at least one of the first image, the second image, or the third image in accordance with a selected mode that is selected from among a plurality of modes, wherein the plurality of modes includes a plurality of still image modes and a plurality of video modes, the plurality of still image modes and the plurality of video modes associated with separate, respective combinations of output speed and bit depth such that the image processor is configured to control an output of the second camera to have a different combination of output speed and bit depth based on the selected mode, wherein the plurality of still image modes includes a first still image mode, a second still image mode, and a third still image mode, the plurality of video modes includes a first video mode and a second video mode, a bit depth of pieces of pixel data of the first camera is 10 or fewer bits, respective bit depths of the first still image mode, the second still image mode, and the third still image mode are within a range of 11 to 14 bits, and a bit depth of the first video mode is within a range of 11 to 13 bits.

16. The mobile electronic device of claim 15, wherein the image processor is configured to control the second camera according at least one of the first, second, or third still image modes and at least one of the first or second video modes to deliver pieces of pixel data of the second camera to the image processor by binning as pieces of RGB color data and pieces of white (W) data.

17. The mobile electronic device of claim 15, wherein, in at least one of the first, second, or third still image modes and at least one of the first or second video modes, a high dynamic range (HDR) function is implemented based on combining an image captured with a first conversion gain and another image captured with a second conversion gain that is different from the first conversion gain.

18. A mobile electronic device, comprising:

a first camera configured to capture a first image of a subject in a first field of view, the first camera including a first image sensor having an RGB array including red (R) pixels, green (G) pixels, and blue (B) pixels;

a second camera configured to capture a second image of the subject in a second field of view, the second field of view being wider than the first field of view, the second camera including a second image sensor having an RGBW array including red (R) pixels, green (G) pixels, blue (B) pixels, and white (W) pixels;

a third camera configured to capture a third image of the subject in a third field of view, the third field of view being wider than the second field of view, the third camera including a third image sensor having a separate RGB array including red (R) pixels, green (G) pixels, and blue (B) pixels; and an image processor configured to generate a target image using at least one of the first image, the second image, or the third image in accordance with a mode selected from among a plurality of modes, wherein the plurality of modes includes a plurality of still image modes and a plurality of video modes, wherein the image processor is configured to control the second camera according at least one of the plurality of still image modes and at least one of the plurality of video modes to deliver pieces of pixel data of the second camera to the image processor by binning as pieces of RGB color data and pieces of white (W) data.

* * * * *